US012765395B2

(12) United States Patent
Lai et al.

(10) Patent No.: US 12,765,395 B2
(45) Date of Patent: Oct. 13, 2026

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Chih-Ting Lai, Hsinchu City (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1159 days.

(21) Appl. No.: 17/672,725

(22) Filed: Feb. 16, 2022

(65) Prior Publication Data

US 2023/0260944 A1 Aug. 17, 2023

(51) Int. Cl.
*H10W 70/09* (2026.01)
*H10P 72/70* (2026.01)
(Continued)

(52) U.S. Cl.
CPC ............. *H10W 70/09* (2026.01); *H10P 72/74* (2026.01); *H10W 20/20* (2026.01); *H10W 20/42* (2026.01);
(Continued)

(58) Field of Classification Search
CPC ... H01L 24/19; H01L 21/568; H01L 21/6835; H01L 23/481; H01L 23/49827; H01L 23/5226; H01L 23/5389; H01L 24/20; H01L 24/97; H01L 25/0657; H01L 2221/68345; H01L 2224/04105; H01L 2224/12105; H01L 2224/73267; H01L 21/486; H01L 23/147; H01L 23/5385; H01L 24/24; H01L 2221/68327; H01L 2221/68368; H01L 24/32; H01L 24/83; H01L 23/49816; H01L 25/105; H01L 2221/68359; H01L 23/3128; H10W 70/09; H10W 74/019; H10W 90/00;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

CN 104733379 A * 6/2015 ......... H01L 21/6835

*Primary Examiner* — Michael Jung
(74) *Attorney, Agent, or Firm* — JCIPRNET

(57) ABSTRACT

A semiconductor package and a manufacturing method thereof are provided. The semiconductor package includes a first redistribution structure, a semiconductor die disposed on the first redistribution structure, a stack of composite conductive structures disposed on the first redistribution structure, and an insulating encapsulation disposed on the first redistribution structure and laterally covering the semiconductor die and the stack of composite conductive structures. The stack of composite conductive structures includes a lower tier and an upper tier stacked upon the lower tier. Each of the lower tier and the upper tier includes a support layer, through material vias (TMVs) penetrating through the support layer, and a conductive adhesive member underlying the support layer and the TMVs.

20 Claims, 12 Drawing Sheets

(51) Int. Cl.

| | |
|---|---|
| ***H10W 20/20*** | (2026.01) |
| ***H10W 20/42*** | (2026.01) |
| ***H10W 70/60*** | (2026.01) |
| ***H10W 70/63*** | (2026.01) |
| ***H10W 72/00*** | (2026.01) |
| ***H10W 74/01*** | (2026.01) |
| ***H10W 90/00*** | (2026.01) |
| *H10W 72/20* | (2026.01) |
| *H10W 72/90* | (2026.01) |

(52) U.S. Cl.
CPC ......... *H10W 70/60* (2026.01); *H10W 70/614* (2026.01); *H10W 70/635* (2026.01); *H10W 72/0198* (2026.01); *H10W 74/019* (2026.01); *H10W 90/00* (2026.01); *H10P 72/7424* (2026.01); *H10W 72/241* (2026.01); *H10W 72/874* (2026.01); *H10W 72/9413* (2026.01)

(58) Field of Classification Search
CPC ............... H10W 70/635; H10W 20/20; H10W 72/0198; H10W 20/42; H10W 70/60; H10P 72/74
See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 2014/0021617 | A1* | 1/2014 | Lu ..................... | H01L 23/49822 438/667 |
| 2016/0043047 | A1* | 2/2016 | Shim ................... | H01L 23/5389 438/126 |

* cited by examiner

SEMICONDUCTOR PACKAGE AND MANUFACTURING METHOD THEREOF

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. The dies of the wafer may be processed and packaged with other semiconductor devices or dies at the wafer level, and various technologies have been developed for wafer level packaging. These and other advanced packaging technologies enable production of semiconductor devices with enhanced functionalities and small footprints. However, there is continuous effort in developing new mechanisms of forming semiconductor packages having improved electrical performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
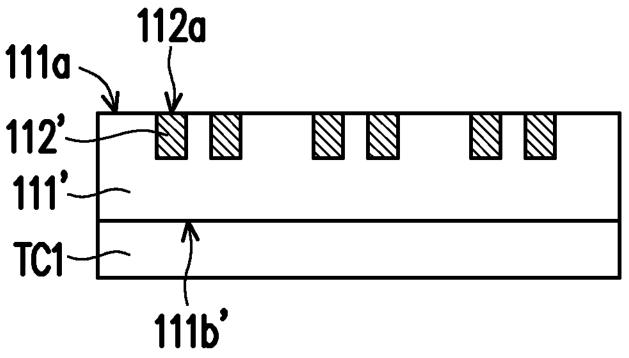
FIGS. 1A-1D show schematic cross-sectional views of structures produced at various stages of a manufacturing method of composite conductive structures according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
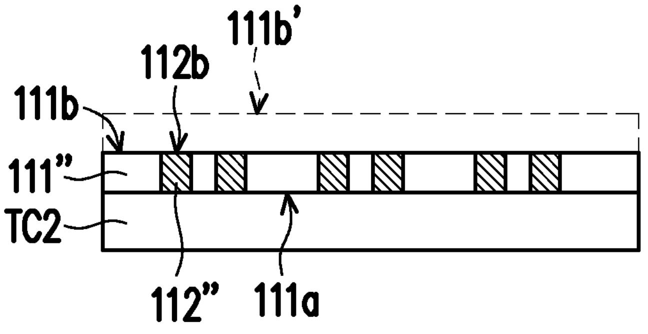
Figure 1C:
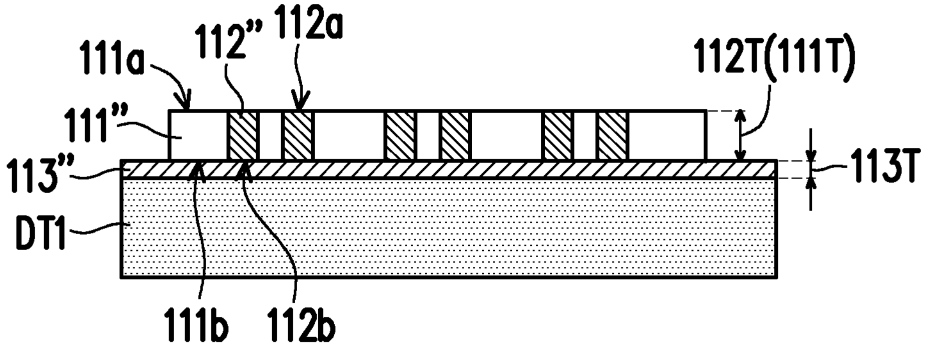
Figure 1D:
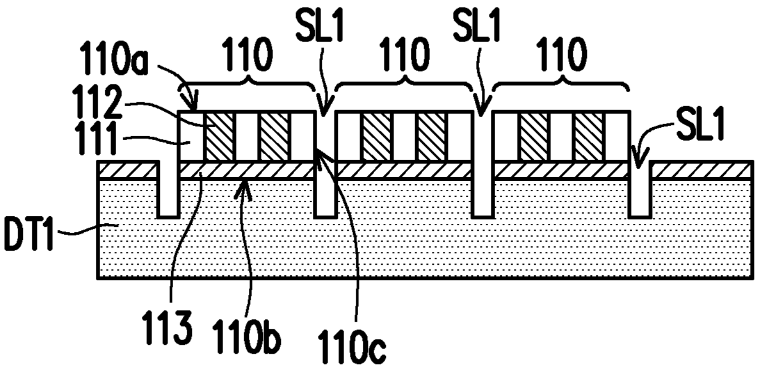
Figure 1E:
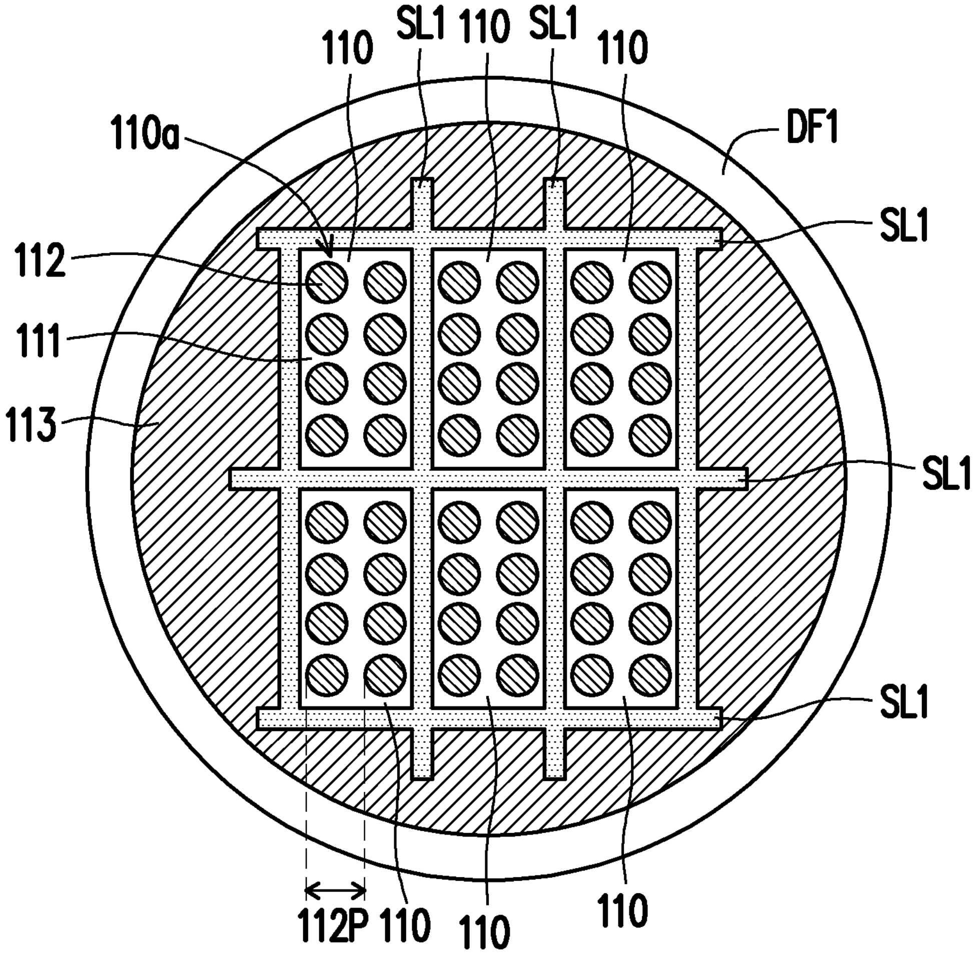
FIG. 1E shows a schematic top-down view of a structure of FIG. 1D according to some embodiments.

FIGS. 1A-1D show schematic cross-sectional views of structures produced at various stages of a manufacturing method of composite conductive structures and FIG. 1E shows a schematic top-down view of a structure of FIG. 1D, in accordance with some embodiments. Referring to FIG. 1A, a semiconductor substrate 111' is disposed on a first temporary carrier TC1, where the semiconductor substrate 111' includes a first surface 111*a* and a second surface 111*b'* that are opposite to each other. The first temporary carrier TC1 may include any suitable material that can provide structural support during the subsequent processing. For example, a material of the first temporary carrier TC1 includes glass, ceramic, silicon, metal, combinations thereof, multi-layers thereof, or the like. In some embodiments, the first temporary carrier TC1 is provided with a de-bonding layer (not individually shown), and the second surface 111*b'* of the semiconductor substrate 111' is placed on the de-bonding layer. The de-bonding layer may be a light-to-heat conversion (LTHC) release layer which can aid the removal of the first temporary carrier TC1 in the subsequent processes.

In some embodiments, the semiconductor substrate 111' includes silicon and is referred to as a silicon substrate. The semiconductor substrate 111' may include another elementary semiconductor, such as germanium; a compound semiconductor including SiC, GaAs, GaP, InP, InAs, and/or InSb; an alloy semiconductor including SiGe, GaAsP, AlInAs, AlGaAs, GaInAs, GaInP, and/or GaInAsP. In some embodiments, the semiconductor substrate 111' is a semiconductor-on-insulator (SOI) substrate. The semiconductor substrate 111' may alternatively be a glass substrate, a ceramic substrate, a polymer substrate, or any other substrate that may provide a suitable protection. In some embodiments, the semiconductor substrate 111' is free from both active and passive devices therein and may be referred to as a dummy substrate.

With continued reference to FIG. 1A, a plurality of conductive pillars 112' is formed in the semiconductor substrate 111'. For example, the semiconductor substrate 111' provided in a wafer level (or a panel level) may include different regions that are singulated in the subsequent steps, and the conductive pillars 112' are formed within those regions. The respective conductive pillar 112' extends from the first surface 111*a* of the semiconductor substrate 111' toward, but do not reach, the second surface 111*b*' of the semiconductor substrate 111'. The conductive pillars 112' may be formed by forming a hole in the semiconductor substrate 111' and forming one or more diffusion barrier layer(s) or isolation layer(s), depositing a seed layer, and depositing a conductive material (e.g., tungsten, titanium, aluminum, copper, alloy, any combinations thereof and/or the like) in the hole. In some embodiments, excess materials formed on the first surface 111*a* of the semiconductor substrate 111' are removed using a planarization process. The first surface 111*a* of the semiconductor substrate 111' may be substantially leveled (or coplanar) with the first surfaces 112*a* of the conductive pillars 112', within process variations.

Referring to FIG. 1B and with reference to FIG. 1A, the semiconductor substrate 111' is then disposed on a second temporary carrier TC2 for thinning. The material of the second temporary carrier TC2 may be similar to that of the first temporary carrier TC1. The second temporary carrier TC2 may (or may not) be provided with a de-bonding layer for facilitating the removal of the second temporary carrier TC2 in the subsequent processes. For example, the first surface 111*a* of the semiconductor substrate 111' and the first surfaces 112*a* of the conductive pillars 112' face toward the second temporary carrier TC2. In some embodiments, the first surface 111*a* of the semiconductor substrate 111' and the first surfaces 112*a* of the conductive pillars 112' are attached to the de-bonding layer on the second temporary carrier TC2. Once the semiconductor substrate 111' is placed on the second temporary carrier TC2, the first temporary carrier TC1 may be released through a de-bonding process. In some embodiments where the first temporary carrier TC1 is provided with a de-bonding layer, the de-bonding process includes applying energy to the de-bonding layer so that the de-bonding layer decomposes under the heat of the energy and the first temporary carrier TC1 may thus be removed. Alternatively, other suitable removal technique (e.g., peeling, grinding, etc.) may be used to release the first temporary carrier TC1.

Next, a thinning process may be performed on the second surface 111*b*' of the semiconductor substrate 111' until at least a portion of the respective conductive pillar 112" is accessibly revealed at the second surface 111*b* of the semiconductor substrate 111". The thinning process may be or may include grinding, chemical-mechanical polishing (CMP), etching, a combination thereof, and/or another process. In some embodiments, the second surface 111*b* of the semiconductor substrate 111" is substantially leveled (or coplanar) with the second surfaces 112*b* of the conductive pillars 112", within process variations. After the thinning process, the respective conductive pillar 112" may penetrate through the semiconductor substrate 111", and thus the conductive pillars 112" may be referred to as through substrate vias (TSVs) or through material vias (TMVs).

Referring to FIG. 1C and with reference to FIG. 1B, the semiconductor substrate 111" with the TSVs 112" is disposed on a conductive adhesive layer 113" over a dicing tape DT1, where the dicing tape may be held by a frame (not individually shown in FIG. 1C, but labeled as "DF1" in FIG. 1E). For example, the structure shown in FIG. 1B is flipped upside-down to be disposed on the conductive adhesive layer 113", where the second surfaces 112*b* of the TSVs 112" and the second surface 111*b* of the semiconductor substrate 111" are attached to the conductive adhesive layer 113". Subsequently, the second temporary carrier TC2 may be released through a de-bonding process. The de-bonding process of the second temporary carrier TC2 may be similar to that of the first temporary carrier TC1, and thus the detailed descriptions are omitted for the sake of brevity.

The conductive adhesive layer 113" may be a polymer layer having electric anisotropy and adhesion, and may exhibit conductive properties in the thickness direction of the layer and insulating properties in the surface direction thereof. The conductive adhesive layer 113" may be formed with non-rigid materials (e.g., film, fabric, or the like) or rigid materials (e.g., glass, ceramic, plastic, or the like). In some embodiments, the conductive adhesive layer 113" is a film-shaped adhesive formed by dispersing conductive particles (e.g., metal, metal alloy, conductive polymer spheres, metal coated and/or alloy coated conductive polymer sphere) in a resin (e.g., epoxy resin or the like). For example, the conductive adhesive layer 113" includes anisotropic conductive film (ACF), anisotropic conductive paste, or the like. The TSVs 112" may be electrically coupled to the conductive adhesive layer 113". In some embodiments, the thickness 113T of the conductive adhesive layer 113" is in a range of about 10 μm to about 20 μm. The thickness 113T of the conductive adhesive layer 113" may be less than the thickness 111T of the semiconductor substrate 111" or may be less than the thickness 112T of the respective TSV 112".

Referring to FIGS. 1D-1E and with reference to FIG. 1C, a singulation process may be performed to separate individual composite conductive structures 110, for example, by cutting through the semiconductor substrate 111" and the underlying conductive adhesive layer 113" along the scribing lanes SL1 arranged between individual composite conductive structures 110. The singulation process may involve performing a wafer dicing process with a rotating blade and/or a laser beam. Although other suitable technique may be applied to form the composite conductive structures 110. Since the composite conductive structures 110 are pre-formed prior to packaging process, the composite conductive structures 110 may be referred to as pre-formed conductive structures.

As shown in the cross-sectional view of FIG. 1D, the respective composite conductive structure 110 has a first surface 110*a*, a second surface 110*b* opposite to the first surface 110*a*, and a coterminous sidewall 110*c* connected to the first surface 110*a* and the second surface 110*b*, where the first surface 110*a* is formed by the first surfaces (111*a* and 112*a* labeled in FIG. 1C) of the semiconductor substrate 111 and the TSVs 112, and the second surface 110*b* is the surface of the conductive adhesive member 113, and the coterminous sidewall 110*c* is formed by the sidewalls of the semiconductor substrate 111 and the conductive adhesive member 113. The conductive adhesive member 113 may be referred to as an anisotropic conductive member based on its material properties. As shown in the top view of FIG. 1E, the composite conductive structures 110 are arranged side-by-side with the scribing lanes SL1 separating one from another. The respective composite conductive structure 110 may have a plurality of TSVs 112 arranged in an array. In some embodiments, the pitch 112P between two adjacent TSVs 112 may be greater than about 8 μm and less than 150 μm, such as between about 20 μm to about 50 μm. It should be noted that although the illustrated top-view shape of the TSVs 112 is circular (or oval), the TSVs 112 may include other suitable top-view shape (e.g., rectangular, square, polygonal, irregular, etc.).

Figure 2A:
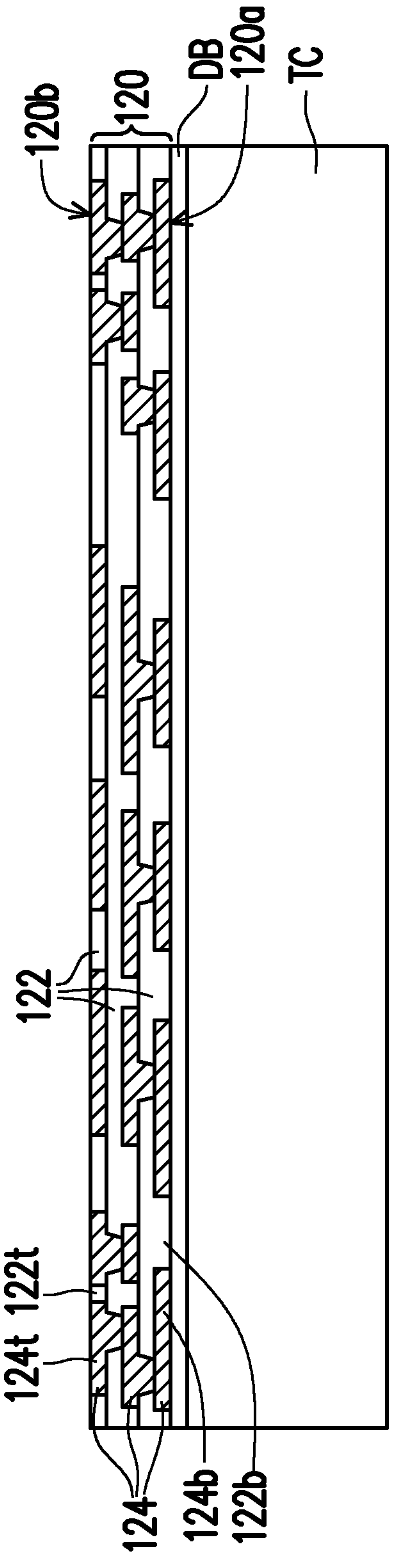
FIGS. 2A-2D show schematic cross-sectional views of structures produced at various stages of a manufacturing method of a semiconductor package having composite conductive structures according to some embodiments.

FIGS. 2A-2D show schematic cross-sectional views of structures produced at various stages of a manufacturing method of a semiconductor package having composite conductive structures according to some embodiments. Referring to FIG. 2A, a first redistribution structure 120 is formed over a temporary carrier TC. The temporary carrier TC may include glass, metal, ceramic, silicon, combinations thereof, multi-layers thereof, or the like. In some embodiments, a de-bonding layer DB is formed on the temporary carrier TC to facilitate releasing the temporary carrier TC from the structure formed thereon in the subsequent process. For example, the de-bonding layer DB includes a layer of LTHC release coating and a layer of associated adhesive (e.g. ultra-violet curable adhesive or a heat curable adhesive layer), or the like. Alternatively, the de-bonding layer is omitted.

In some embodiments, the first redistribution structure 120 includes a first dielectric layer 122 and a first patterned conductive layer 124 embedded in the first dielectric layer 122. In some embodiments, one or more layers of dielectric materials are represented collectively as the first dielectric layer 122, and the first patterned conductive layer 124 may be redistribution wirings that include vias, pads and/or traces that form the electrical connections. For example, these redistribution wirings are formed layer-by-layer and alternately stacked on the layers of dielectric materials. In some embodiments, the first dielectric layer 122 is formed of a polymeric material such as polybenzoxazole (PBO), polyimide (PI), benzocyclobutene (BCB), or other suitable material that can be patterned using lithography. The first dielectric layer 122 is formed using any suitable method, such as a spin-on coating process, a deposition process, and/or the like. In some embodiments, the first patterned conductive layer 124 is formed of conductive material such as copper, titanium, tungsten, aluminum, metal alloy, a combination of these, or the like.

In some embodiments, the formation of the first redistribution structure 120 includes at least the following steps. A seed layer (not shown) may be formed over the temporary carrier TC. For example, the seed layer is a metal layer, which may be a single layer (e.g., copper or copper alloys) or a composite layer including sub-layers formed of different materials (e.g., titanium and copper). A photoresist (not shown) is then formed and patterned on the seed layer in accordance with a desired metallization pattern. A conductive material is formed in the openings of the photoresist and on the exposed portions of the seed layer. Then, the photoresist and portions of the seed layer on which the conductive material is not formed are removed. The remaining portions of the seed layer and conductive material form the bottommost one 124*b* of the first patterned conductive layer 124. The bottommost one 124*b* of the first patterned conductive layer 124 may include under bump metallization (UBM) pads that provide electrical connections to the first redistribution structure 120 upon which external terminals (e.g., solder balls/bumps, conductive pillars, or the like) may be placed. After forming the bottommost one 124*b* of the first patterned conductive layer 124, the bottommost one 122*b* of the first dielectric layer 122 is formed over the temporary carrier TC to cover the bottommost one 124*b* of the first patterned conductive layer 124. For example, the dielectric material is formed and patterned to form the bottommost one 122*b* of the first dielectric layer 122 with openings, where the openings may accessibly expose at least a portion of the bottommost one 124*b* of the first patterned conductive layer 124.

The first patterned conductive layer 124 may be formed after forming the first dielectric layer 122. In some embodiments in which the first dielectric layer 122 is formed before forming the first patterned conductive layer 124, the UBM pads are formed after removing the temporary carrier TC. It should be noted that the forming sequence of the first dielectric layer 122 and the first patterned conductive layer 124 depends on the design requirement and construes no limitation in the disclosure. Additional layers of dielectric material and additional conductive patterns may then be formed on the bottommost one 122*b* of the first dielectric layer 122 to form additional electrical connections within the first redistribution structure 120. The layers of dielectric material and additional conductive patterns may be formed using similar materials and processes as used to form the bottommost one 122*b* of the first dielectric layer 122 and the bottommost one 124*b* of the first patterned conductive layer 124. The abovementioned steps may be performed multiple times to obtain a multi-layered redistribution structure as required by the circuit design. The numbers of the first dielectric layer 122 and the first patterned conductive layer 124 may be selected based on demand and are not limited in the disclosure.

Still referring to FIG. 2A, the first redistribution structure 120 includes a first surface 120*a* and a second surface 120*b* opposite to each other, where the first surface 120*a* faces the temporary carrier TC and may be attached to the de-bonding layer DB. The first surface 120*a* may be substantially planar and may include surfaces of the bottommost one 122*b* of the first dielectric layer 122 and the bottommost one 124*b* of the first patterned conductive layer 124. The second surface 120*b* may also be substantially planar and may include the topmost one 124*t* of the first patterned conductive layer 124 and the topmost one 122*t* of the first dielectric layer 122 that are substantially leveled with one another.

Figure 2B:
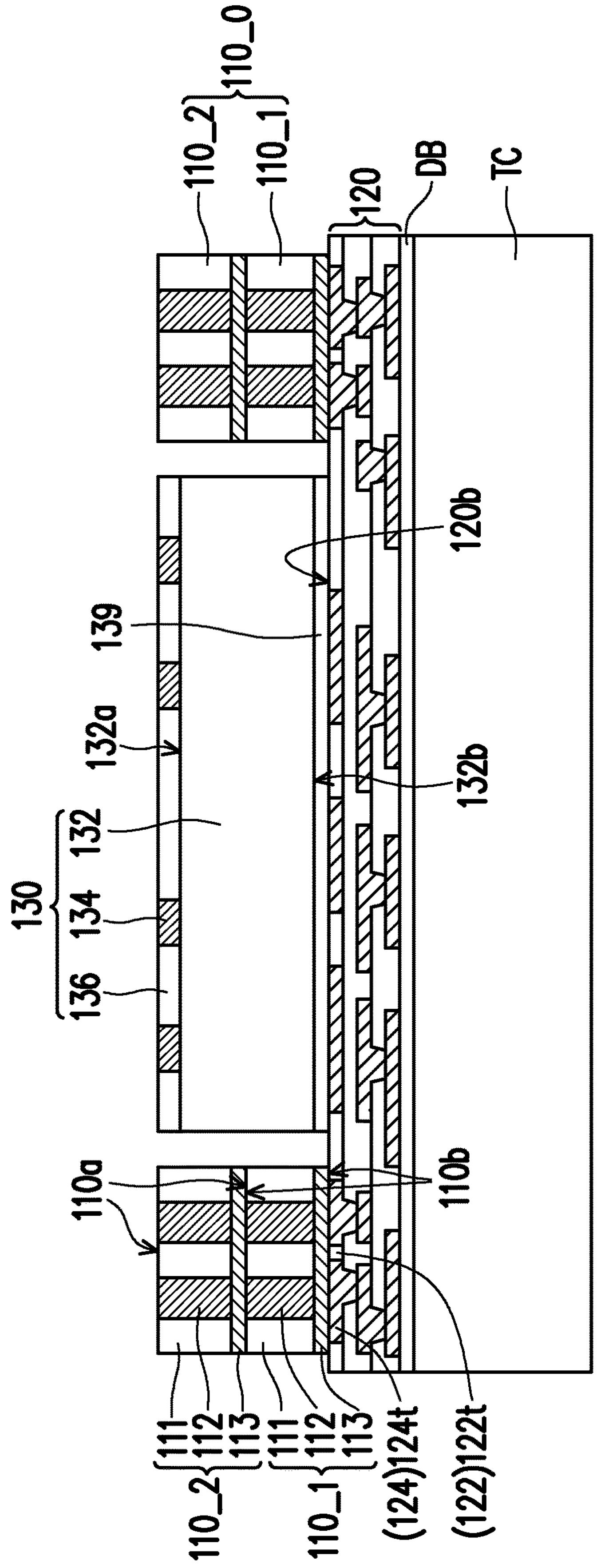

Referring to FIG. 2B and with reference to FIG. 2A, a semiconductor die 130 and at least one stack of composite conductive structures 110_0 may be disposed over the first redistribution structure 120. In FIG. 2B, only one semiconductor die 130 is shown as an example, but it is understood that more than one semiconductor dies or different types of semiconductor dies may be included within the semiconductor package. The semiconductor die 130 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 130 is formed in a device wafer, which may include different die regions that are singulated in subsequent steps to form a plurality of semiconductor dies 130. After singulation, the semiconductor die 130 is placed on the predetermined location by, for example, a pick-and-place process.

In some embodiments, the semiconductor die 130 includes a semiconductor substrate 132 having an active surface 132*a* and a back surface 132*b* opposite to each other, a plurality of die connectors 134 distributed over the active surface 132*a* of the semiconductor substrate 132, and a passivation layer 136 formed over the active surface 132*a* of the semiconductor substrate 132 and laterally covering the die connectors 134. The semiconductor die 130 may be attached to the second surface 120*b* of the first redistribution structure 120 through a die attach film (DAF) 139 that is disposed on the back surface 132*b* of the semiconductor substrate 132 for better adhering the semiconductor die 130 to the first redistribution structure 120. Alternatively, the DAF is omitted. It is noted that the illustration of the semiconductor die 130 is simplified and multiple layers and/or components may be included within the semiconductor die 130.

The semiconductor substrate 132 may include a bulk semiconductor substrate, SOI substrate, multi-layered semiconductor substrate, etc. The material of the semiconductor substrate 132 may be silicon, germanium, a compound/alloy semiconductor (e.g., SiC, SiGe, GaAsP, AlInAs, AlGaAs, GaInAs, GaInP, GaInAsP, etc.), or combinations thereof. The semiconductor substrate 132 may be doped or undoped. In other embodiments, multi-layered or gradient semiconductor substrates are used. In some embodiments, a plurality of semiconductor devices (not individually shown) is formed at the active surface 132*a* of the semiconductor substrate 132, where the semiconductor devices may be or may include active devices (e.g., transistor or the like) and passive devices (e.g., resistors, capacitors, inductors, etc.). The die connectors 134 may be or may include conductive pads (e.g., aluminum pads, copper pads or other suitable metallic pads) and/or conductive posts (e.g., copper posts or copper alloy posts). For example, the die connectors 134 and the layers (not shown) over the semiconductor substrate 132 and connected to the die connectors 134 are formed in a back end of line (BEOL) process to achieve fine line-spacing requirements. The passivation layer 136 may be a single layer or a multi-layered structure, including a silicon oxide layer, a silicon nitride layer, a silicon oxy-nitride layer, a dielectric layer formed by other suitable dielectric materials or combinations thereof.

With continued reference to FIG. 2B, the semiconductor die 130 may be placed on the first redistribution structure 120, and then a plurality of lower tiers 110_1 of composite conductive structures may be disposed on the first redistribution structure 120 and surround the semiconductor die 130. Next, a plurality of upper tiers 110_2 of composite conductive structures may be stacked upon the lower tiers 110_1 to form a plurality of stacks of composite conductive structures 110_0. Each of the upper tier and the lower tier (110_1 and 110_2) of composite conductive structures may be formed by the method described in FIGS. 1A-1D, and thus the detailed descriptions are omitted. Like reference numbers refer to like components. Since the upper tiers 110_2 and the lower tiers 110_1 are pre-formed, the composite conductive structures (110_1 and 110_2) may be referred to as pre-formed conductive structures. The second surface 110*b* of the respective lower tier 110_1 may be attached to the second surface 120*b* of the first redistribution structure 120. For example, the conductive adhesive member 113 of the respective lower tier 110_1 is in physical and electrical contact with the topmost one 124*t* of the first patterned conductive layer 124 and also in physical contact with the topmost one 122*t* of the first dielectric layer 122.

Next, the second surface 110*b* of the respective upper tier 110_2 may be attached to the first surface 110*a* of the corresponding lower tier 110_1. For example, the conductive adhesive member 113 of the respective upper tier 110_2 is in physical and electrical contact with the TSVs 112 of the lower tier 110_1 and also in physical contact with the semiconductor substrate 111 of the lower tier 110_1. For example, the TSVs 112 of the upper tier 110_2 are electrically coupled to the first patterned conductive layer 124 of the first redistribution structure 110 through the conductive adhesive member 113 of the respective upper tier 110_2 and the TSVs 111 and the conductive adhesive member 113 of the respective lower tier 110_1.

In some embodiments, the lower tier 110_1 is substantially aligned with the upper tier 110_2. For example, the TSVs 111 of the upper tier 110_2 are substantially and vertically aligned with the TSVs 111 of the lower tier 110_1 by using alignment marks (not shown) formed on the semiconductor die 110 when placing each tier of the composite conductive structures. Alternatively, the TSVs 111 of the upper tier 110_2 are offset from the TSVs 111 of the lower tier 110_1, as will be described later in FIG. 3. It should be noted that the tier number of the composite conductive structures in each stack is merely an example, and more than two tiers can be stacked upon one another depending on the overall height of the semiconductor die 130.

Figure 2C:
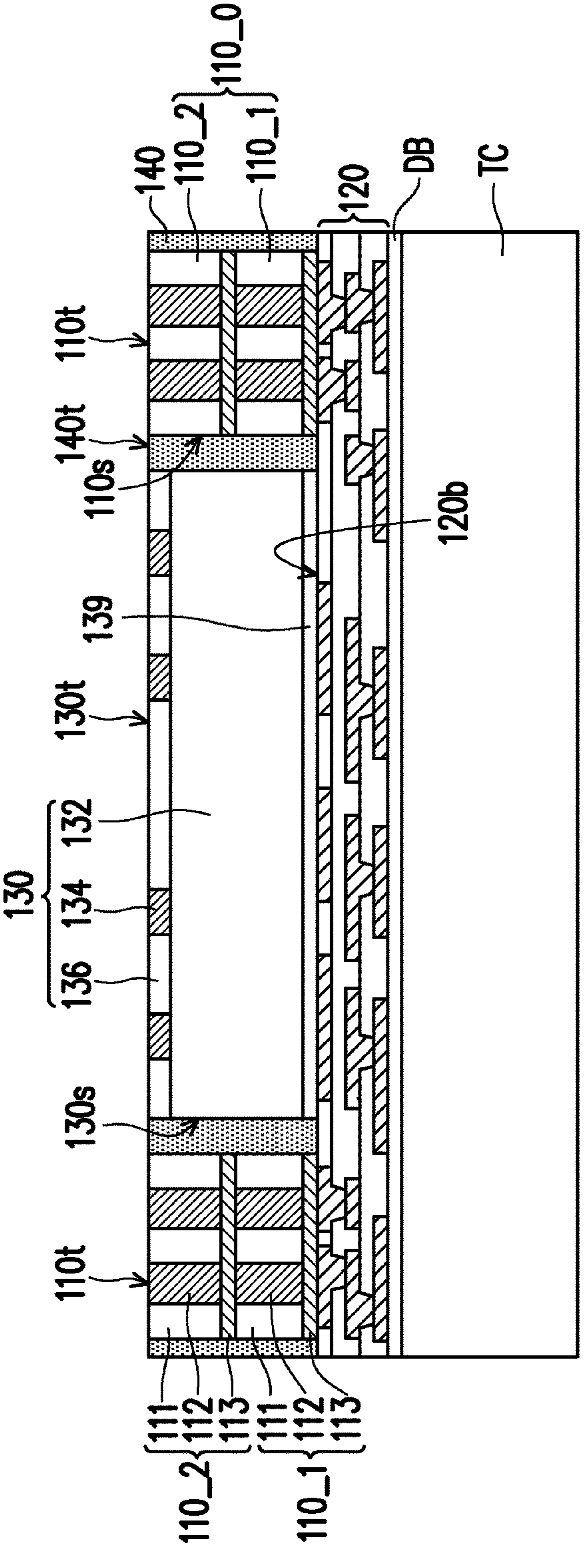

Referring to FIG. 2C and with reference to FIG. 2B, an insulating encapsulation 140 may be formed on the second surface 120*b* of the first redistribution structure 120 to laterally cover the stacks of composite conductive structures 110_0, the semiconductor die 130, and the DAF 139. The insulating encapsulation 140 may be or may include molding compound, molding underfill, epoxy resin, phenolic resins, silicon-containing resins, or the like. In some embodiments, the material of the insulating encapsulation 140 includes fillers (not shown). The insulating encapsulation 140 may be applied by compression molding, transfer molding, or the like. For example, the semiconductor die 130, the DAF 139, and the stacks of composite conductive structures 110_0 are over-molded by a molding material, and then excess molding material is removed to accessibly reveal the semiconductor die 130 and the stacks of composite conductive structures 110_0. For example, a planarizing process (e.g., grinding, CMP, etching, combination of these, etc.) is performed on the molding material until at least a portion of the TSVs 112 of the upper tiers 110_2 and a portion of the die connectors 134 of the semiconductor die 130 are accessibly revealed.

After the planarization, the top surface 110*t* of each stack of composite conductive structures 110_0, the top surface 140*t* of the insulating encapsulation 140, and the top surface 130*t* of the semiconductor die 130 become substantially leveled and flush with one another, within process variations. The top surface 110*t* of each stack of composite conductive structures 110_0 may include the top surfaces of the semiconductor substrate 111 and the TSVs 112 of the upper tiers 110_2, and the top surface 130*t* of the semiconductor die 130 includes the top surfaces of the die connectors 134 and the passivation layer 136. The insulating encapsulation 140 extends along the sidewalls 110*s* of the each stack of composite conductive structures 110_0, the sidewalls 130*s* of the semiconductor die 130, and the sidewalls of the DAF 139. For example, the sidewalls 110*s* of the each stack of composite conductive structures 110_0 including sidewalls of the semiconductor substrates 111 and the conductive adhesive members 113 are in direct contact with the insulating encapsulation 140, and the sidewalls 130*s* of the semiconductor die 130 including the sidewalls of the semiconductor substrate 132 and the passivation layer 136 are also in direct contact with the insulating encapsulation 140.

Figure 2D:
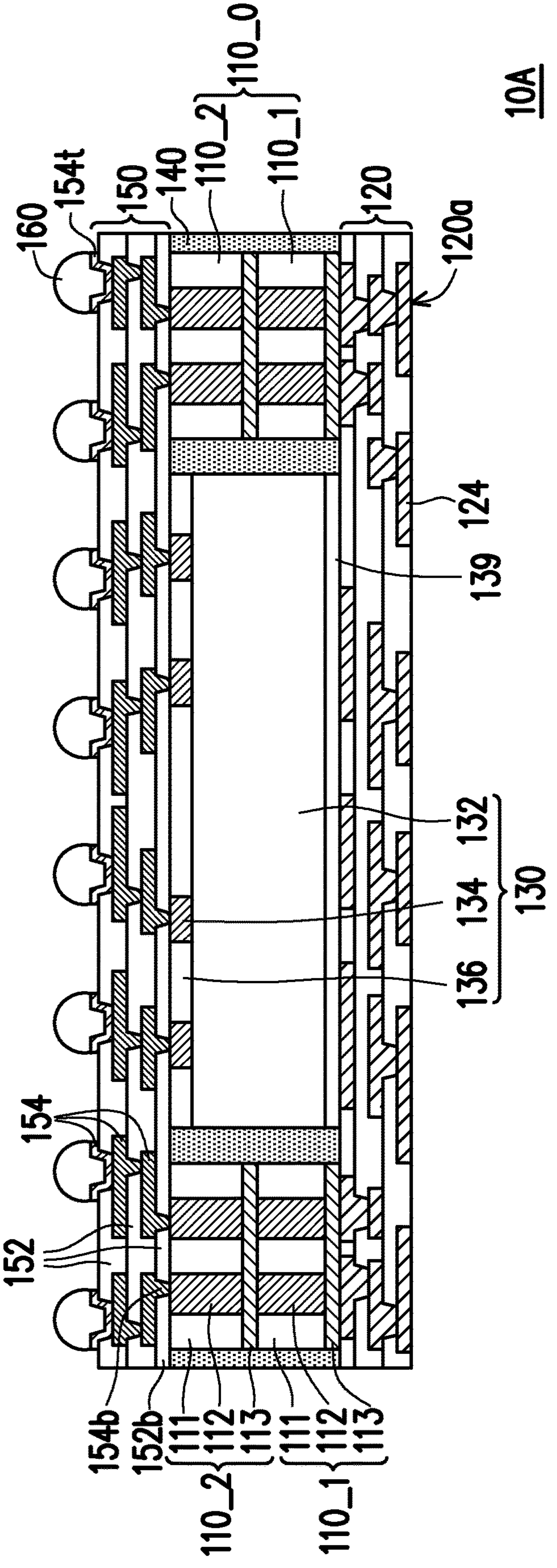

Referring to FIG. 2D and with reference to FIG. 2C, a second redistribution structure 150 is formed on the stacks of composite conductive structures 110_0, the semiconductor die 130, and the insulating encapsulation 140. The second redistribution structure 150 may include a second dielectric layer 152 and a second patterned conductive layer 154 embedded in the second dielectric layer 152. In some embodiments, one or more than one layers of dielectric materials are represented collectively as the second dielectric layer 152, and conductive features (e.g. conductive lines, conductive pads, and/or conductive vias) are collectively represented as the second patterned conductive layer 154. As shown in FIG. 2D, the conductive vias in the second patterned conductive layer 154 are tapered toward the die connectors 134 of the semiconductor die 130 and the TSVs 112. The conductive vias in the second patterned conductive layer 154 are tapered toward the same direction as the conductive vias in the first patterned conductive layer 124 of the first redistribution structure 120. The materials of the second patterned conductive layer 154 and the second dielectric layer 152 may be similar to those of the first patterned conductive layer 124 and the first dielectric layer 122, so the details are not repeated for brevity.

Still referring to FIGS. 2C-2D, the second redistribution structure 150 may be formed by first forming the bottommost one 152*b* of the second dielectric layer 152 on the stacks of composite conductive structures 110_0, the semiconductor die 130, and the insulating encapsulation 140. For example, the dielectric material is formed on the top surface 110*t* of each stack of composite conductive structures 110_0, the top surface 140*t* of the insulating encapsulation 140, and the top surface 130*t* of the semiconductor die 130. Next, a portion of the dielectric material is removed to form the bottommost one 152*b* of the second dielectric layer 152 with openings, where at least a portion of the top surfaces of the TSVs 112 and a portion of the die connectors 134 are accessibly revealed by the openings. The bottommost one 154*b* of the second patterned conductive layer 154 is subsequently formed. For example, conductive vias of the bottommost one 154*b* of the second patterned conductive layer 154 are formed in the openings of the bottommost one 152*b* of the second dielectric layer 152 to be in physical and electrical contact with TSVs 112 and the die connectors 134, and other portions (e.g., lines, pads, etc.) of the bottommost one 154*b* of the second patterned conductive layer 154 are formed and extend on the bottommost one 152*b* of the second dielectric layer 152. In other embodiments, the second patterned conductive layer 154 is formed prior to the formation of the second dielectric layer 152. It should be noted that the forming sequence of the second dielectric layer 152 and the second patterned conductive layer 154 depends on the design requirement and construes no limitation in the disclosure.

Additional second dielectric materials and additional second patterned conductive materials are be optionally formed on the bottommost one 152*b* of the second dielectric layer 152 to form additional electrical connections within the second redistribution structure 150. The additional second dielectric materials and additional second patterned conductive materials may be formed using similar processes as used to form the bottommost one 152*b* of the second dielectric layer 152 and the bottommost one 154*b* of the second patterned conductive layer 154. For example, the above-mentioned steps are performed multiple times to obtain a multi-layered redistribution structure as required by the circuit design. The numbers of the second dielectric layer 152 and the second patterned conductive layer 154 may be selected based on demand and are not limited in the disclosure. In some embodiments, the topmost one 154*t* of the second patterned conductive layer 154 includes UBM pads for further electrical connection. Given their placement in the structure, the second redistribution structure 150 may be referred to as a front-side redistribution structure, and the first redistribution structure 120 may be referred to as a back-side redistribution structure.

With continued reference to FIGS. 2C-2D, a plurality of conductive terminals 160 is formed on the topmost one 154*t* of the second patterned conductive layer 154 of the second redistribution structure 150. The conductive terminals 160 may be or may include ball-grid-array (BGA) terminals, solder balls, controlled collapse chip connection (C4) bumps, electroless nickel-electroless palladium-immersion gold (ENEPIG) bumps, micro bumps, metal pillars, combination thereof (e.g., a metal pillar having a solder ball attached thereof), or the like. The conductive terminals 160 may be formed using any suitable formation method such as ball placement, plating, printing, solder transfer, or the like. In some embodiments in which the conductive terminals 160 include solder material, a reflow process is performed to shape the solder material into the desired bump shapes. Subsequently, a de-bonding process may be performed to remove the temporary carrier TC. The de-bonding process may include any suitable technique, such as shining a light beam over the surface of the temporary carrier TC to release the de-bonding layer DB, etching, grinding, mechanical peel off, etc. After removing the temporary carrier TC, the first surface 120*a* of the first redistribution structure 120 is accessibly exposed.

In some embodiments, the aforementioned steps are performed in a wafer level (or a panel level), and the resulting structure is cut by a singulation process, thereby separating the resulting structure into a plurality of semiconductor packages 10A. The singulation process may be performed along scribe lanes (e.g., between adjacent device regions of the plurality of semiconductor packages 10A) to cut through the first redistribution structure 120, the insulating encapsulation 140, and the second redistribution structure 150. The singulation process may include a sawing process, a laser cut process, an etching process, combinations thereof, or the like. After singulation, the respective semiconductor package 10A has a coterminous sidewall formed by sidewalls of the first redistribution structure 120, the insulating encapsulation 140, and the second redistribution structure 150. For example, the first redistribution structure 120, the insulating encapsulation 140, and the second redistribution structure 150 have a substantially same width, and the sidewalls of these may be substantially leveled with one another.

Still referring to FIG. 2D, the semiconductor package 10A includes the semiconductor die 130 electrically coupled to the first redistribution structure 120 through the second patterned conductive layer 154 of the second redistribution structure 150, the TSVs 112 and the conductive adhesive members 113 of the stacks of composite conductive structures 110_0. The TSVs 112 of the stacks of composite conductive structures 110_0 may provide finer via pitch interconnection and have high aspect ratio. The conductive adhesive members 113 (e.g., ACF, anisotropic conductive paste, or the like) includes conductive particles (not individually shown) which provide anisotropic electrical conductivity between the overlying TSVs 112 and the underlying TSVs 112 and also between the TSVs 112 and the underlying first patterned conductive layer 124 of the first redistribution structure 120. As the size of the TSVs 112 becomes smaller, the conductive adhesive members 113 having fine pitch capability is provided to assure satisfactory electrical conductivity or impedance. For example, a minimum pitch of the conductive adhesive member 113 is about 8 μm. Although other fined pitch ACF may be used depending on product requirements. Combinations of the TSVs 112 and the conductive adhesive members 113 in each stack of composite conductive structures 110_0 may achieve a finer pitch interconnect structure in the semiconductor package 10A.

The semiconductor package 10A may include more than one composite conductive structure (110_1 and 110_2) stacked vertically to substantially match the overall height of the semiconductor die 130. This provides improved design flexibility as the number of stacked composite conductive structures can be adjusted depending on demands. In addition, the semiconductor substrate 111 laterally covering the TSVs 112 in each tier of composite conductive structures (110_1 and 110_2) provides structural support for preventing the TSVs 112 from collapsing during subsequent processing. The semiconductor substrate 111 providing structurally support may be referred to as a support layer. The semiconductor package 10A may be then mounted on a package component and/or another package component may be stacked upon the semiconductor package 10A, as will be described later in FIG. 7.

Figure 3:
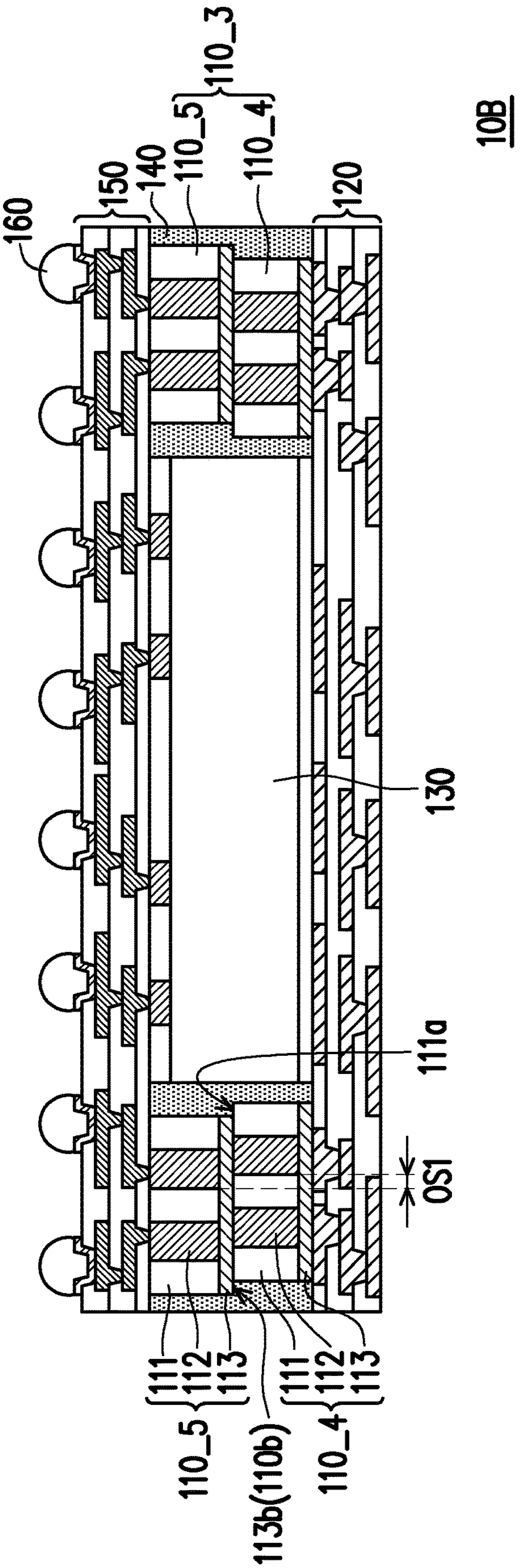
FIG. 3 shows a schematic cross-sectional view of a semiconductor package having composite conductive structures according to some embodiments.

FIG. 3 shows a schematic cross-sectional view of a semiconductor package having composite conductive structures according to some embodiments. Referring to FIG. 3 and with reference to FIG. 2D, the semiconductor package 10B is similar to the semiconductor package 10A shown in FIG. 2D, and thus like reference numbers refer to like components. The difference between the semiconductor packages (10B and 10A) lies in the stacks of composite conductive structures 110_3. For example, the respective stack of composite conductive structures 110_3 includes the lower tier 110_4 and the upper tier 110_5 stacked upon and laterally offset from the lower tier 110_4.

In some embodiments, the peripheral portion of the first surface 111*a* of the semiconductor substrate 111 of the lower tier 110_4 is accessibly exposed by the upper tier 110_5 and may be in physical contact with the insulating encapsulation 140. In some embodiments, the peripheral portion of the second surface 113*a* of the conductive adhesive member 113 of the upper tier 110_5 is accessibly exposed by the lower tier 110_4 and may be in physical contact with the insulating encapsulation 140. The TSVs 112 of the lower tier 110_4 are laterally offset from the TSVs 112 of the upper tier 110_5 in the cross-sectional view. For example, a respective TSV 112 of the upper tier 110_5 partially overlaps and is staggered with the TSV 112 of the lower tier 110_4 by an offset OS1, where the offset is non-zero. The conductive adhesive member 113 of the upper tier 110_5 may still be electrically coupled the TSVs 112 of the upper and lower tiers (110_5 and 110_4).

Figure 4A:
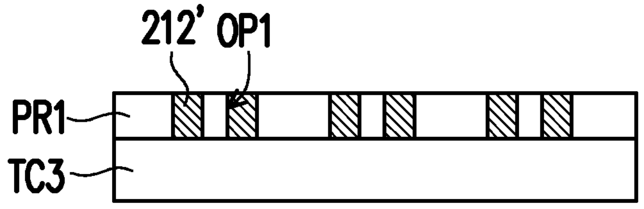
FIGS. 4A-4D show schematic cross-sectional views of structures produced at various stages of a manufacturing method of composite conductive structures according to some embodiments.
Figure 4B:
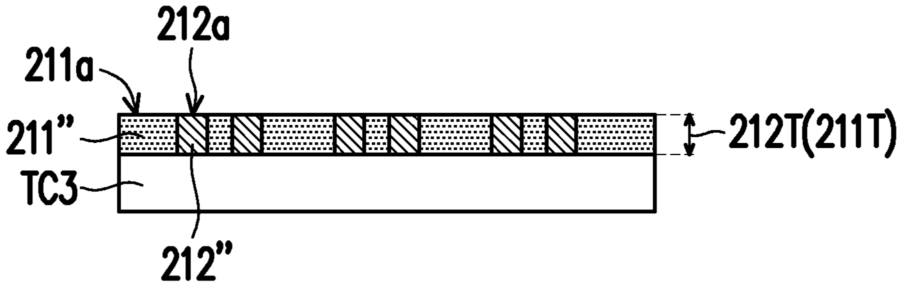
Figure 4C:
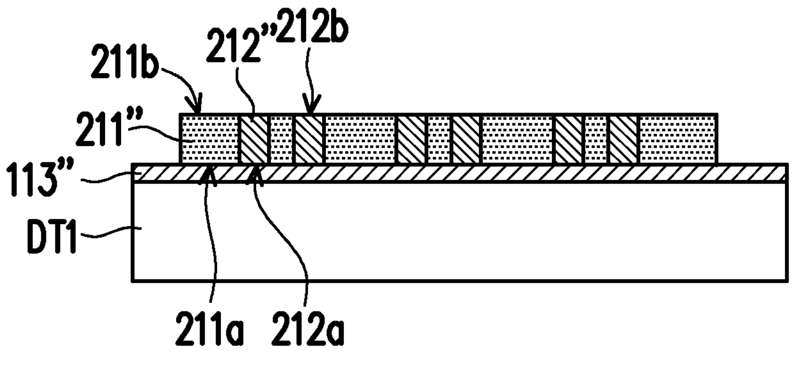
Figure 4D:
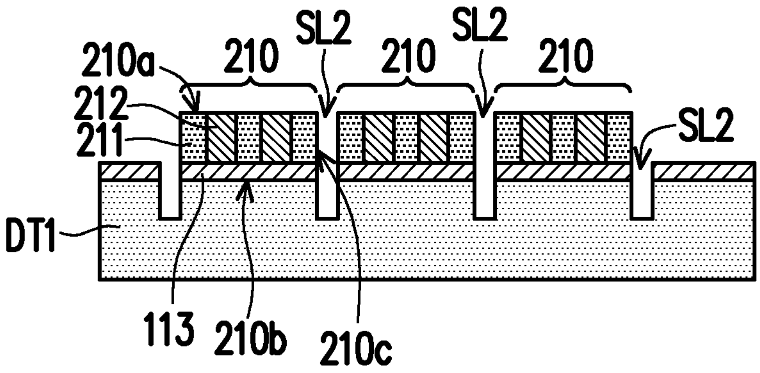
Figure 4E:
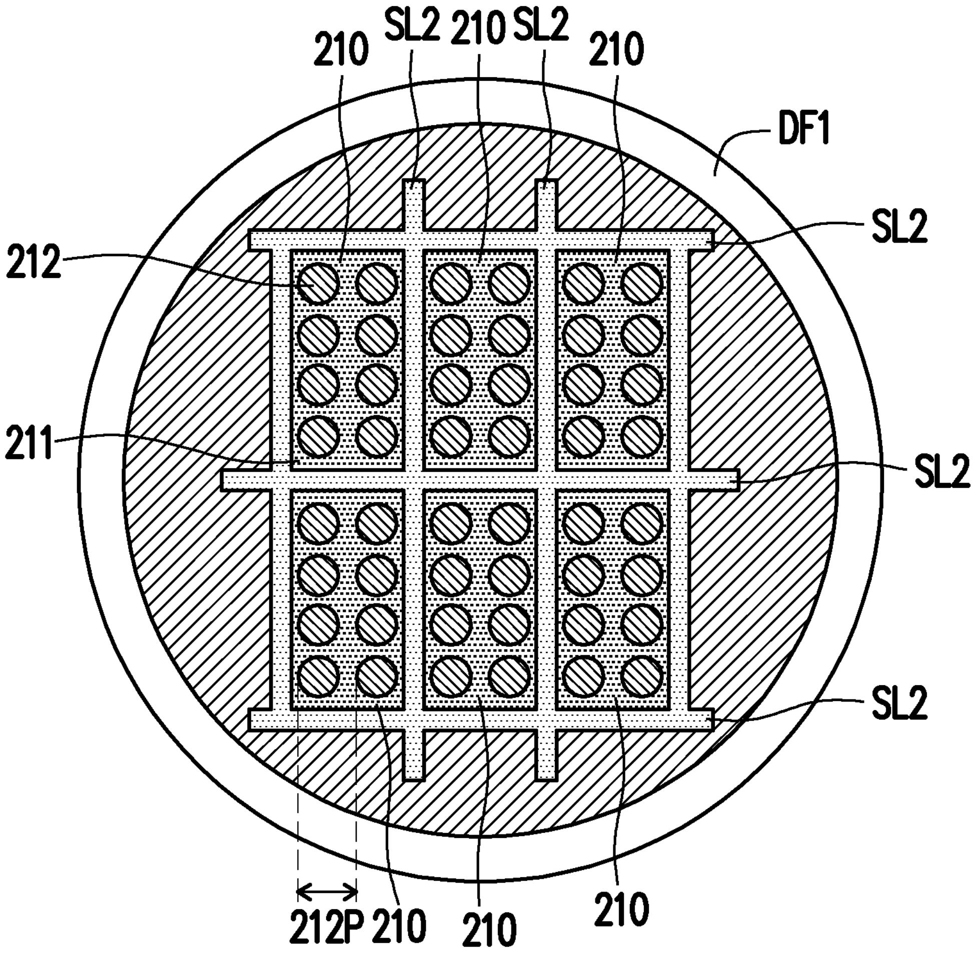
FIG. 4E shows a schematic top-down view of a structure of FIG. 4D according to some embodiments.

FIGS. 4A-4D show schematic cross-sectional views of structures produced at various stages of a manufacturing method of composite conductive structures and FIG. 4E shows a schematic top-down view of a structure of FIG. 4D, in accordance with some embodiments. Unless specified otherwise, the materials and the formation processes of the components in these embodiments are essentially the same as the like components, which are denoted by like reference numerals in the preceding embodiments shown in FIGS. 1A-1E. The details regarding the formation processes and the materials of the components shown in the subsequent figures may thus be found in the discussion of the preceding embodiments.

Referring to FIG. 4A, a plurality of conductive pillars 212' is formed in openings OP1 of a sacrificial layer PR1 over a temporary carrier TC3. The temporary carrier TC3 is similar to the first temporary carrier TC1 described in FIG. 1A, and thus the detailed descriptions are omitted for brevity. The sacrificial layer PR1 may be a photoresist, which may be spin-coated onto the temporary carrier TC3 and then patterned to form the openings OP1 using a lithographic patterning process. The conductive pillars 212' may be formed in the openings OP1 by electroplating or electroless plating or other suitable deposition process. For example, a seed layer (not individually shown) may be first formed on the temporary carrier TC3 and in the openings OP1, and then conductive material (e.g., copper, aluminum, gold, nickel, silver, palladium, tin, alloy, the like) is formed on the seed layer and fills the openings OP1 to form the conductive pillars 212'. Subsequently, the sacrificial layer PR1 may be removed using, for example, an ashing process followed by a wet clean process. Alternatively, a seed layer is first formed on the temporary carrier TC3, and then the sacrificial layer PR1 having the openings OP1 is formed on the seed layer. Next, the conductive material is formed on the seed layer and fills the openings OP1. The sacrificial layer PR1 and portions of the seed layer on which the conductive material is not formed are then removed. The remaining portions of the seed layer and conductive material may thus form the conductive pillars 212'.

Referring to FIG. 4B and with reference to FIG. 4A, once the sacrificial layer PR1 is removed, an insulating layer 211" is formed on the temporary carrier TC3. The insulating layer 211" may be or may include a molding compound, a molding underfill, a resin (e.g., an epoxy resin), or the like, and may be applied by compression molding, transfer molding, or the like. In some alternative embodiments, the insulating layer 211" may be or may include silicon oxide, silicon nitride, the like, or combinations thereof. The insulating layer 211" may be a polymer with or without fillers (e.g., silica-based fillers or glass fillers) added in the polymer. For example, an insulating material is first formed on the temporary carrier TC to bury the conductive pillars 212', and then a curing process is performed to harden the insulating material. A planarization process (e.g., grinding, CMP, etching, combination of these, etc.) is optionally performed on the insulating material until at least a portion of the conductive pillars 212' is accessibly exposed, and thus the insulating layer 211" is formed to laterally cover the conductive pillars 212".

In some embodiments, the first surface 211*a* of insulating layer 211" is substantially leveled (or coplanar) with the first surfaces 212*a* of the conductive pillars 212", within process variations. Since the conductive pillars 212" penetrate through the insulating layer 211", the conductive pillars 212" may be referred to as through-material vias (TMVs). The thickness 211T of the insulating layer 211" is substantially equal to the thickness 212T of the conductive pillars 212". For example, the thickness 211T is about 100 μm, such as in a range of about 80 μm to about 200 μm. In some embodiments where the insulating layer is made of a ceramic layer such as silicon oxide, silicon nitride, or the like, the thickness 211T of the insulating layer 211" may be less than 50 μm, such as in a range of about 10 μm to about 50 μm. Under this scenario, the insulating layer 211" is rigid enough to endure the subsequently transferring process. For example, the Young's modulus of the insulating layer 211" is in a range of about 10 GPa and about 40 GPa.

Referring to FIG. 4C and with reference to FIG. 4B, the insulating layer 211" and the conductive pillars 212" may be disposed on the conductive adhesive layer 113" over the dicing tape DT1. For example, the structure shown in FIG. 4B is flipped upside-down to be attached to the conductive adhesive layer 113", where the first surface 211*a* of insulating layer 211" and the first surfaces 212*a* of the conductive pillars 212" are in direct contact with the conductive adhesive layer 113". The conductive adhesive layer 113" and the dicing tape DT1 are similar to the conductive adhesive layer 113" and the dicing tape DT1 described in FIG. 1C, and thus the detailed descriptions are omitted for brevity. The temporary carrier TC3 is then released through a de-bonding process. The de-bonding process of the temporary carrier TC3 may be similar to that of the first temporary carrier TC1, and thus the detailed descriptions are omitted for the sake of brevity. After removing the temporary carrier TC3, the second surfaces (211*b* and 212*b*) of the insulating layer 211" and the conductive pillars 212" are accessibly revealed, where the second surfaces (211*b* and 212*b*) may be substantially leveled (or coplanar) with one another, within process variations.

Referring to FIGS. 4D-4E and with reference to FIG. 4C, a singulation process may be performed to separate composite conductive structures 210, for example, by cutting through the insulating layer 211" and the underlying conductive adhesive layer 113" along the scribing lanes SL2 arranged between individual composite conductive structures 210. The singulation process may involve performing a wafer dicing process with a rotating blade and/or a laser beam. Although other suitable technique may be applied to form the composite conductive structures 210. Since the composite conductive structures 210 are performed prior to packaging process, the composite conductive structures 210 may be referred to as pre-formed conductive structures.

As shown in the cross-sectional view of FIG. 4D, the respective composite conductive structure 210 has a first surface 210*a*, a second surface 210*b* opposite to the first surface 210*a*, and a coterminous sidewall 210*c* connected to the first surface 210*a* and the second surface 210*b*, where the first surface 210*a* includes the second surfaces (211*b* and 212*b*) of the insulating layer 211 and the TMVs 212, and the second surface 210*b* is the surface of the conductive adhesive member 113, and the coterminous sidewall 210*c* includes the sidewalls of the insulating layer 211 and the conductive adhesive member 113. As shown in the top view of FIG. 4E, the composite conductive structures 210 are arranged side-by-side with the scribing lanes SL2 separating one from another. The respective composite conductive structure 210 may have a plurality of TMVs 212 arranged in an array. The pitch 212P between two adjacent TMVs 212 may be greater than about 8 μm and less than 150 μm, such as between about 80 μm to about 150 μm. The insulating layer 211 laterally covering the TMVs 212 provides structural support for preventing the TMVs 212 from collapsing during subsequent processing, and may be referred to as a support layer. It should be noted that although the illustrated top-view shape of the TMVs 212 is circular (or oval), the TMVs 212 may include other suitable top-view shape (e.g., rectangular, square, polygonal, irregular, etc.).

Figure 5:
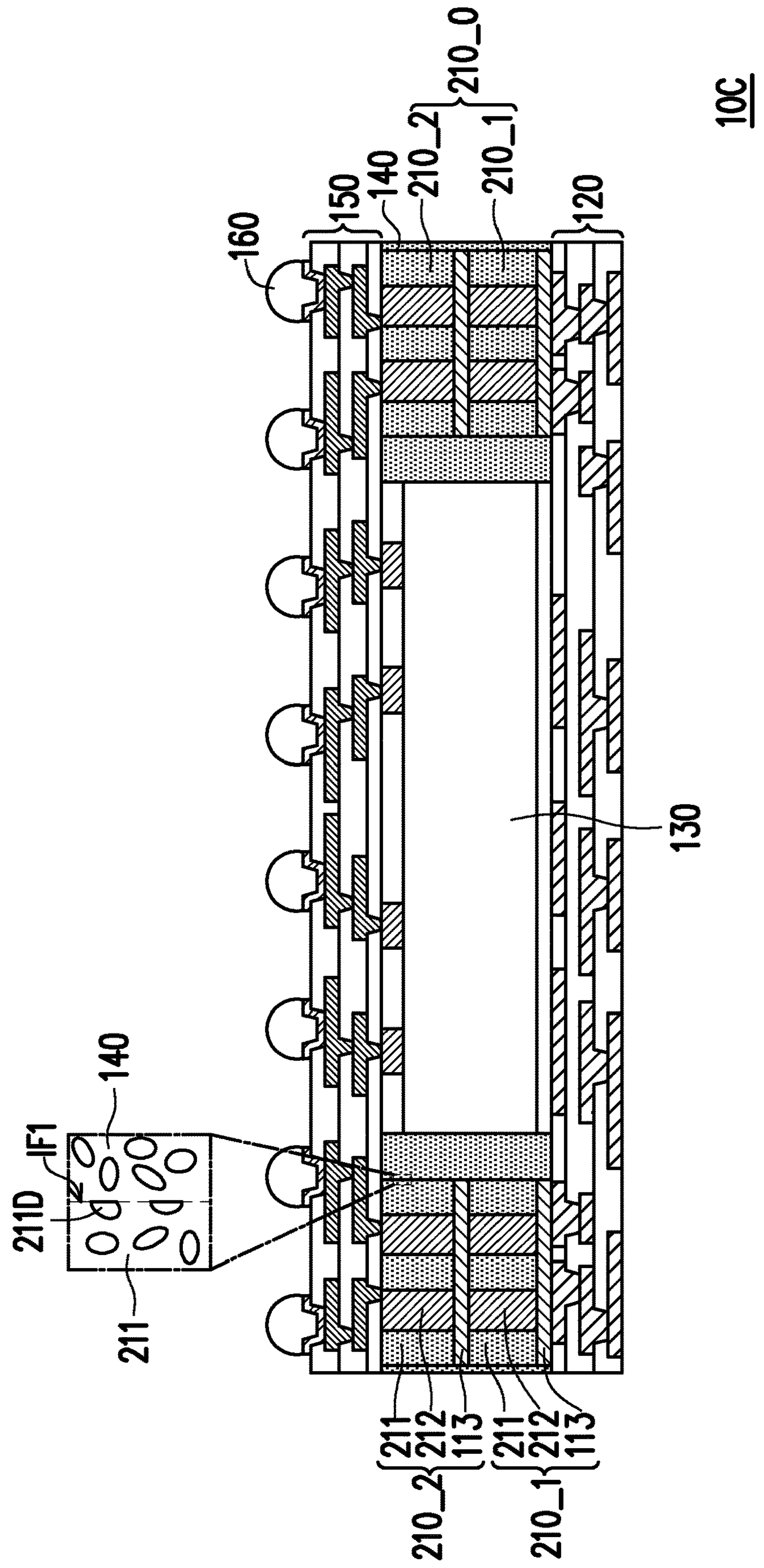
FIGS. 5-6 show schematic cross-sectional view of different semiconductor packages according to some embodiments.
Figure 6:
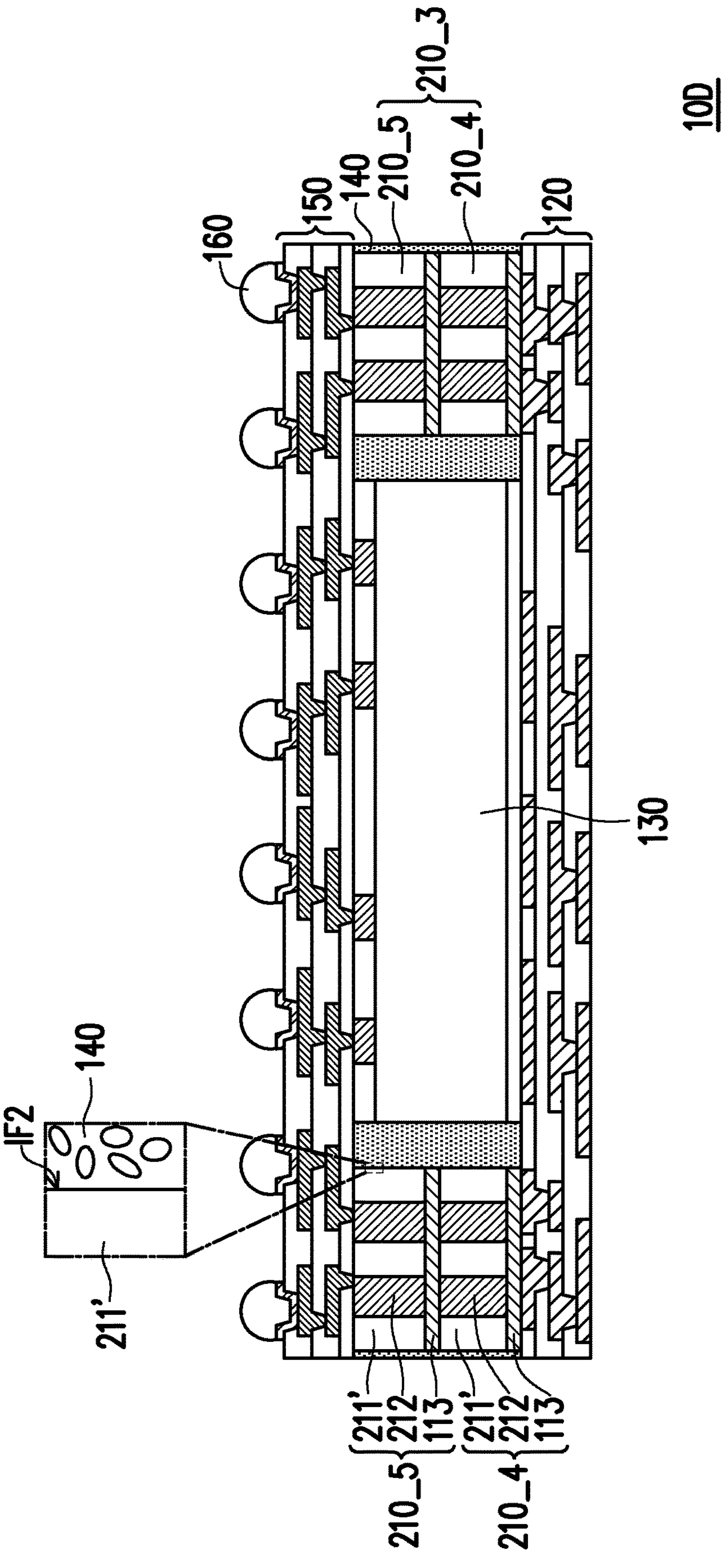

FIGS. 5-6 show schematic cross-sectional view of different semiconductor packages according to some embodiments. Referring to FIG. 5 and with reference to FIG. 2D, the forming method of the semiconductor package 10C is similar to that of the semiconductor package 10A described in the preceding paragraphs, and thus like reference numbers refer to like components. The difference between the semiconductor packages (10C and 10A) lies in the stacks of composite conductive structures 210_0. For example, the stacks of composite conductive structures 210_0 are formed by stacking the composite conductive structures 210 fabricated by the method described in FIGS. 4A-4D.

In some embodiments, after the singulation process as described in FIG. 4D, the composite conductive structure 210 is picked and placed on the first redistribution structure 120 to act as the lower tier 210_1, and then another composite conductive structure 210 is stacked upon the lower tier 210_1 to act as the upper tier 210_2. Next, the insulating encapsulation 140 is formed on the first redistribution structure 120 to laterally cover the stacks of composite conductive structures 210_0 and the semiconductor die 130. In some embodiments, the insulating encapsulation 140 and the insulating layer 211 are formed of similar materials (e.g., molding compound), in which case the insulating encapsulation 140 and the insulating layer 211 may merge during formation such that no discernible interface exist between them. Therefore, the interface IF1 is illustrated in the dashed line to indicate it may (or may not) exist. Since each tier of the composite conductive structures (210_1 and 210_2) has been singulated before covering by the insulating encapsulation 140, diced fillers 211D in the insulating layer 211 may be observed at the interface IF1 of the insulating encapsulation 140 and the insulating layer 211. For example, diced marks can be found on outer surfaces of those diced fillers 211D. On the other hand, the fillers in the insulating encapsulation 140 at the interface IF1 are not diced and may be intact.

Referring to FIG. 6 and with reference to FIG. 5, the semiconductor package 10D is similar to the semiconductor package 10C shown in FIG. 5, and thus like reference numbers refer to like components. The difference between the semiconductor packages (10D and 10C) lies in the stacks of composite conductive structures 210_3. For example, the stack of composite conductive structures 210_3 is formed by stacking the upper tier 210_5 on the lower tier 210_4. At least one of the upper tier 210_5 and the lower tier 210_4 includes the insulating layer 211' that is made of a material different from the insulating encapsulation 140, and thus a visible interface IF2 can be observed between the insulating encapsulation 140 and the stack of composite conductive structures 210_3. For example, the insulating layer 211' is free of fillers. As shown in the enlarged view, fillers are distributed in the insulating encapsulation 140, while no filler is in the insulating layer 211'. It should be noted that the stacks of composite conductive structures (210_0 and 210_3) shown in FIGS. 5-6 are merely examples, the upper tier and the lower tier of the stack of composite conductive structures may be offset as described in FIG. 3. Alternatively, any one of the upper tier and the lower tier may be replaced with the composite conductive structure 110 as described in the previous embodiments.

Figure 7:
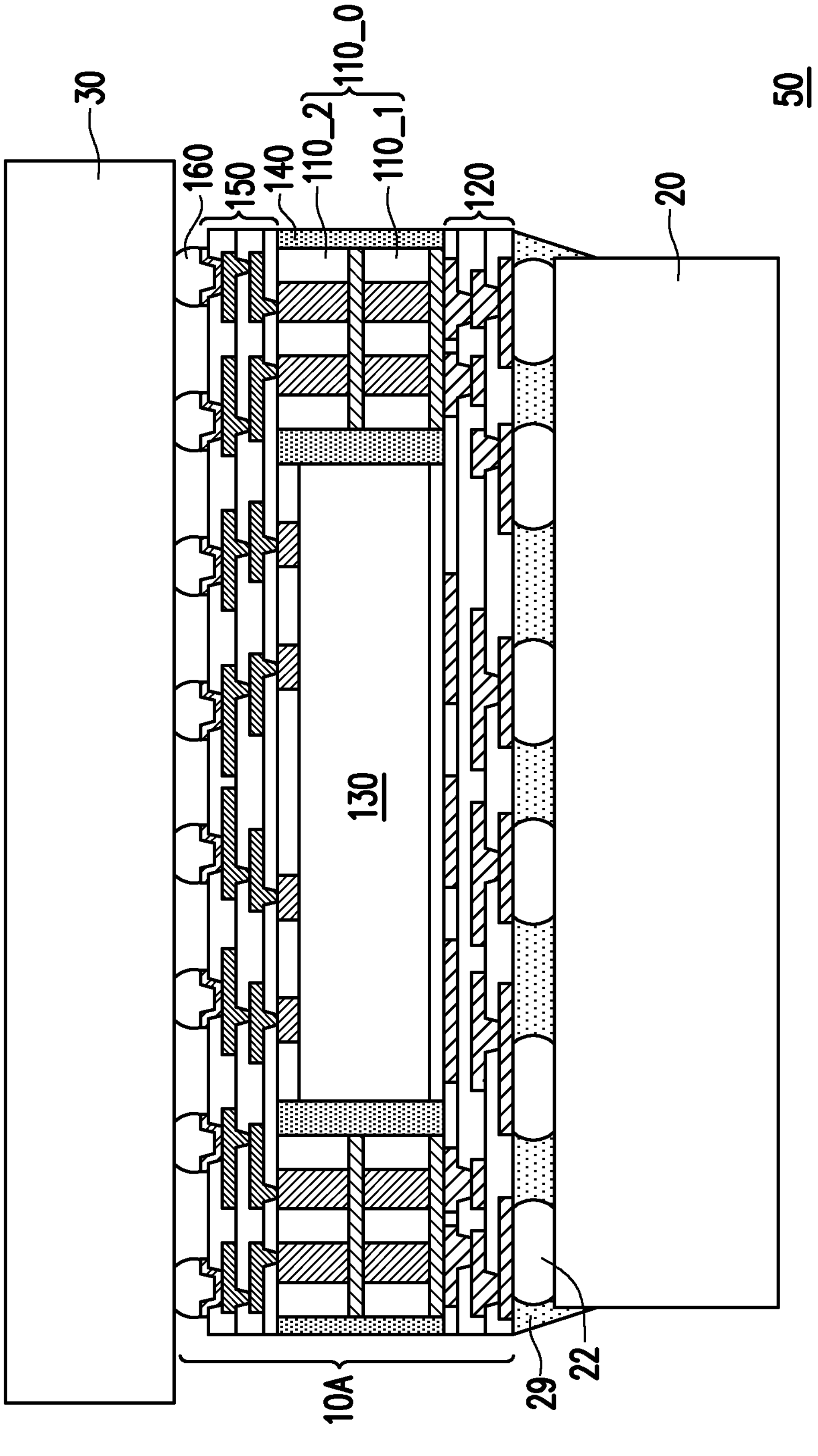
FIG. 7 shows a schematic cross-sectional view of an electronic device according to some embodiments.

FIG. 7 shows a schematic cross-sectional view of an electronic device according to some embodiments. Throughout the various views and illustrative embodiments, like reference numbers are used to designate like elements. Referring to FIG. 7 and with reference to FIG. 2D, an electronic device 50 includes a first package component 20 coupled to the semiconductor package 10A. By way of example, and not by limitation, the first package component 20 may be a memory device, such as dynamic random access memory (DRAM) or static random access memory (SRAM), a radio frequency (RF) device, a mixed signal device, or any other form of integrated circuit package. For example, the first package component 20 is provided with a plurality of external terminals 22. The external terminals 22 may be or may include BGA terminals, solder balls, C4 bumps, ENEPIG bumps, micro bumps, metal pillars, combination thereof, or the like. The external terminals 22 of the first package component 20 may be disposed on the first redistribution structure 120 of the semiconductor package 10A, and then a reflow process may be performed to mount the first package component 20 onto the semiconductor package 10A. An underfill layer 29 is optionally formed in a gap between the first redistribution structure 120 and the first package component 20 to surround the external terminals 22 for protection.

In some embodiments, the electronic device 50 includes the semiconductor package 10A mounted on a second package component 30. For example, the conductive terminals 160 of the semiconductor package 10A are disposed on the second package component 30, and then a reflow process may be performed on the conductive terminals 160 to couple the semiconductor package 10A to the second package component 30. The second package component 30 may be or may include an interposer, a printed circuit board (PCB), a printed wiring board, a package substrate, a system board, a motherboard, and/or other circuit carrier that is capable of carrying the semiconductor package 10A. It should be noted that the semiconductor package 10A of the electronic device 50 may be replaced with any semiconductor package (e.g., 10B, 10C, or 10D) described in the disclosure. The electronic device 50 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

In accordance with some embodiments, a semiconductor package includes a first redistribution structure, a semiconductor die disposed on the first redistribution structure, a stack of composite conductive structures disposed on the first redistribution structure, and an insulating encapsulation disposed on the first redistribution structure and laterally covering the semiconductor die and the stack of composite conductive structures. The stack of composite conductive structures includes a lower tier and an upper tier stacked upon the lower tier. Each of the lower tier and the upper tier includes a support layer, through material vias (TMVs) penetrating through the support layer, and a conductive adhesive member underlying the support layer and the TMVs.

In accordance with some embodiments, a semiconductor package includes a semiconductor die, a stack of composite conductive structures disposed adjacent the semiconductor die, an insulating encapsulation extending along sidewalls of the semiconductor die and the stack of composite conductive structures, and a first redistribution structure and a second redistribution structure disposed on two opposing sides of the semiconductor die. The stack of composite conductive structures includes a lower tier and an upper tier stacked upon the lower tier. Each of the lower tier and the upper tier includes a support layer, through material vias (TMVs) penetrating through the support layer, and an anisotropic conductive member underlying the support layer and the TMVs. The semiconductor die is electrically coupled to the first redistribution structure through the second redistribution structure, the TMVs, and the anisotropic conductive members.

In accordance with some embodiments, a manufacturing method of a semiconductor package includes at least the following steps. A plurality of composite conductive structures is formed, wherein each of the composite conductive structures comprises a support layer, through material vias (TMVs) penetrating through the support layer, and a conductive adhesive member underlying the support layer and the TMVs. A semiconductor die is disposed on a first redistribution structure. One of the composite conductive structures is disposed on the first redistribution structure, and another one of the composite conductive structures is stacked on the one of the composite conductive structures to form a stack of composite conductive structures. An insulating encapsulation is formed on the first redistribution structure to laterally cover the stack of composite conductive structures and the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a first redistribution structure;

a semiconductor die disposed on the first redistribution structure;

a stack of composite conductive structures disposed on the first redistribution structure, the stack of composite conductive structures comprising:

a lower tier and an upper tier stacked upon the lower tier, each of the lower tier and the upper tier comprising:

a support layer;

through material vias (TMVs) penetrating through the support layer; and a conductive adhesive member underlying the support layer and the TMVs; and an insulating encapsulation disposed on the first redistribution structure and laterally covering the semiconductor die and the stack of composite conductive structures, wherein a thickness of the stack of composite conductive structures is substantially the same as a thickness of the insulating encapsulation.

2. The semiconductor package of claim 1, further comprising:

a second redistribution structure disposed on the semiconductor die, the upper tier of the stack of composite conductive structures, and the insulating encapsulation, wherein the semiconductor die is electrically coupled to the first redistribution structure through the second redistribution structure, the TMVs, and the conductive adhesive members.

3. The semiconductor package of claim 1, wherein the support layer of at least one of the upper tier and the lower tier of the stack of composite conductive structures is a semiconductor substrate.

4. The semiconductor package of claim 1, wherein the support layer of at least one of the upper tier and the lower tier of the stack of composite conductive structures is a molding layer.

5. The semiconductor package of claim 4, wherein fillers are distributed in the support layer at an interface of the support layer and the insulating encapsulation.

6. The semiconductor package of claim 1, wherein the support layer of at least one of the upper tier and the lower tier of the stack of composite conductive structures is an insulating layer which is free of fillers.

7. The semiconductor package of claim 1, wherein the upper tier is laterally offset from the lower tier in a cross-sectional view.

8. The semiconductor package of claim 1, wherein a top surface of the upper tier of the stack of composite conductive structures is substantially leveled with a top surface of the semiconductor die and a top surface of the insulating encapsulation.

9. The semiconductor package of claim 8, wherein the top surface of the upper tier of the stack of composite conductive structures comprises top surfaces of the TMVs and the support layer.

10. The semiconductor package of claim 1, wherein the conductive adhesive member of the lower tier of the stack of composite conductive structures is in physical and electrical contact with a topmost patterned conductive layer of the first redistribution structure.

11. A semiconductor package, comprising:
- a semiconductor die;
- a stack of composite conductive structures disposed adjacent the semiconductor die, the stack of composite conductive structures comprising:
  - a lower tier and an upper tier stacked upon the lower tier, each of the lower tier and the upper tier comprising:
    - a support layer;
    - through material vias (TMVs) penetrating through the support layer; and
    - a conductive adhesive member underlying the support layer and the TMVs;
- an insulating encapsulation extending along sidewalls of the semiconductor die and the stack of composite conductive structures, wherein a thickness of the stack of composite conductive structures is substantially the same as a thickness of the insulating encapsulation; and
- a first redistribution structure and a second redistribution structure disposed on two opposing sides of the semiconductor die, wherein the semiconductor die is electrically coupled to the first redistribution structure through the second redistribution structure, the TMVs, and the conductive adhesive members.

12. The semiconductor package of claim 11, wherein the support layer is a semiconductor substrate or a molding layer.

13. The semiconductor package of claim 11, wherein the semiconductor die is attached to the first redistribution structure through a die attach film, and the lower tier of the stack of composite conductive structures is attached to the first redistribution structure through the conductive adhesive member of the lower tier.

14. The semiconductor package of claim 11, wherein top surfaces of the TMVs and the support layer of the upper tier of the stack of composite conductive structures are substantially leveled with top surfaces of the semiconductor die and the insulating encapsulation.

15. A manufacturing method of a semiconductor package, comprising:
- forming a plurality of composite conductive structures, wherein each of the composite conductive structures comprises a support layer, through material vias (TMVs) penetrating through the support layer, and a conductive adhesive member underlying the support layer and the TMVs;
- disposing a semiconductor die on a first redistribution structure;
- disposing one of the composite conductive structures on the first redistribution structure to form a lower tier of a stack of composite conductive structures;
- stacking another one of the composite conductive structures on the one of the composite conductive structures to form an upper tier of the stack of composite conductive structures; and
- forming an insulating encapsulation on the first redistribution structure to laterally cover the stack of composite conductive structures and the semiconductor die, wherein a thickness of the stack of composite conductive structures is substantially the same as a thickness of the insulating encapsulation.

16. The manufacturing method of claim 15, wherein forming the composite conductive structures comprises:
- forming conductive pillars in a semiconductor substrate;
- disposing the semiconductor substrate with conductive pillars on the conductive adhesive member; and
- performing a singulation process to cut through the semiconductor substrate and the conductive adhesive member to form the composite conductive structures.

17. The manufacturing method of claim 16, further comprising:
- forming a second redistribution structure on the insulating encapsulation, the stack of composite conductive structures, and the semiconductor die, wherein a patterned conductive layer of the second redistribution structure is in physical contact with the TMVs of the another one of the composite conductive structures and die connectors of the semiconductor die.

18. The manufacturing method of claim 15, wherein forming the composite conductive structures comprises:
- covering conductive pillars with an insulating material;
- performing a planarization process on the insulating material to form the support layer with the TMVs;
- disposing the support layer with the TMVs on the conductive adhesive member; and
- performing a singulation process to cut through the support layer and the conductive adhesive member to form the composite conductive structures.

19. The manufacturing method of claim 15, wherein forming the insulating encapsulation comprising:
- performing a planarization process so that the top surface of the insulating encapsulation is substantially leveled with top surfaces of the semiconductor die and the stack of composite conductive structures.

20. The manufacturing method of claim 15, wherein stacking the another one of the composite conductive structures on the one of the composite conductive structures comprises:
- attaching the conductive adhesive member of the another one of the composite conductive structures to the support layer and the TMVs of the one of the composite conductive structures.

* * * * *